(12) United States Patent
Xie (10) Patent No.: US 9,184,170 B2
(45) Date of Patent: Nov. 10, 2015

(54) METHOD FOR FINFET SRAM RATIO TUNING

(71) Applicant: Semiconductor Manufacturing International (Shanghai) Corporation, Shanghai (CN)

(72) Inventor: Xinyun Xie, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/250,355

(22) Filed: Apr. 10, 2014

(65) Prior Publication Data

US 2015/0102423 A1  Apr. 16, 2015

(30) Foreign Application Priority Data

Oct. 10, 2013 (CN) .......................... 2013 1 0471092

(51) Int. Cl.
*H01L 27/00* (2006.01)
*H01L 27/11* (2006.01)
*H01L 29/66* (2006.01)
*H01L 21/8234* (2006.01)
*H01L 27/088* (2006.01)

(52) U.S. Cl.
CPC ...... *H01L 27/1104* (2013.01); *H01L 29/66803* (2013.01); *H01L 21/823431* (2013.01); *H01L 27/088* (2013.01)

(58) Field of Classification Search
CPC .............. H01L 27/088; H01L 27/1104; H01L 21/823431; H01L 29/66803
USPC ......................................................... 257/390
See application file for complete search history.

(56) References Cited

U.S. PATENT DOCUMENTS

| | | | | |
|---|---|---|---|---|
| 5,479,036 | A * | 12/1995 | Hong | 257/315 |
| 7,488,653 | B2 * | 2/2009 | Menut et al. | 438/276 |
| 8,120,092 | B2 * | 2/2012 | Sato et al. | 257/319 |
| 8,120,116 | B2 * | 2/2012 | Takeuchi | 257/369 |
| 8,809,150 | B2 * | 8/2014 | Zhang et al. | 438/285 |
| 8,835,997 | B2 * | 9/2014 | Chang et al. | 257/288 |
| 8,916,428 | B2 * | 12/2014 | Wang et al. | 438/183 |
| 2002/0135002 | A1 * | 9/2002 | Nissa | 257/296 |
| 2011/0068400 | A1 * | 3/2011 | Wang et al. | 257/347 |
| 2011/0221006 | A1 * | 9/2011 | Chen et al. | 257/390 |
| 2012/0187504 | A1 * | 7/2012 | Igarashi et al. | 257/390 |
| 2013/0154027 | A1 * | 6/2013 | Liaw | 257/390 |
| 2014/0177312 | A1 * | 6/2014 | Shibata et al. | 365/72 |

* cited by examiner

*Primary Examiner* — Nathan Ha
(74) *Attorney, Agent, or Firm* — Kilpatrick Townsend and Stockton LLP (57) ABSTRACT

A semiconductor device and method of forming the same include a substrate having a plurality of memory cells formed thereon. A memory cell includes pass-gate transistors, pull-up transistors, and pull-down transistors. The pass-gate transistors and a portion of the pull-down transistors have different doping concentrations.

12 Claims, 6 Drawing Sheets

METHOD FOR FINFET SRAM RATIO TUNING

CROSS-REFERENCES TO RELATED APPLICATIONS

The present application claims priority to Chinese patent application No. 201310471092.7, entitled "A METHOD FOR FINFET SRAM RATIO TUNING", filed with the State Intellectual Property Office of People's Republic of China on Oct. 10, 2013, the content of which is incorporated herein by reference in its entirety.

FIELD OF THE INVENTION

The present invention relates to semiconductor memory devices, and more particularly to a semiconductor device, an electronic device including SRAM tuned ratios, and manufacturing methods thereof.

BACKGROUND OF THE INVENTION

The ongoing development of semiconductor memory technology is driving memory devices to higher level of integration, lower power consumption, and faster speed. Compared to dynamic random access memory (DRAM) devices, static random access memory (SRAM) devices do not need to periodically refresh the memory cells to maintain the data stored therein. Therefore, SRAM devices have been widely used in many applications.

Recently, fin-type transistors, such as fin field effect transistors (finFETs), have been used to replace planar transistors in logic devices. Embedded static random access memory (SRAM) devices have been widely used, SRAM bit cells have thus, been designed using FinFETs. In a FinFET bit cell, the channel has raised, fin-like structure, allowing the gate to be placed on two or more sides of the channel to improve conduction and leakage control. As the fin width is constant, it is not convenient to use the width of the active area to define the finFET SRAM ratio as is the case in conventional planar SRAM devices.

When the SRAM bit cells are formed using finFETs, the effective width is constant, the SRAM ratio may only be adjusted by changing the critical dimension (CD). However, when compared with planar SRAM devices, finFET RAM devices may have a smaller process window. It is thus challenging to widen the process window for finFET formed SRAM devices.

BRIEF SUMMARY OF THE INVENTION

Embodiments of the present invention provide a method of forming a semiconductor device. The method includes providing a front-end device having a plurality of memory cells. Each memory cell includes at least two pull-up transistors, at least two pull-down transistors, and at least two pass-gate transistors. The pull-up transistors, the pull-down transistors, and the two pass-gate transistors each have a gate and opposite gate sidewalls. The method further includes performing a first lightly doped source and drain ion implantation into the at least two pull-down transistors and the at least two pass-gate transistors, and performing a second lightly doped source and drain ion implantation into a portion of the at least two pull-down transistors and the at least two pass-gate transistors.

In an embodiment, the first lightly doped source and drain ion implantation is performed by forming a first mask over the pull-up transistors and applying a first angled ion implantation at a first tilt angle into the pull-down transistors and the pass-gate transistors. The second lightly doped source and drain ion implantation is performed by applying a second angled ion implantation at a second tilt angle into a portion of the pull-down transistors. The first and second tilt angles are angles relative to a direction perpendicular to a surface of the front-end device. The first tilt angle is smaller than the second tilt angle.

In an embodiment, a portion of the pull-down transistors disposed in the shadow region of the first mask is not doped in the second angled ion implantation.

In an embodiment, the first mask is formed by patterning a photoresist layer.

In an embodiment, the first lightly-doped ion implantation includes forming a second mask over the at least two pull-up transistors, and performing a lightly-doped ion implantation into the at least two pull-down transistors and the at least pass-gate transistors. Performing the second lightly doped source and drain ion implantation includes removing the second mask, forming a third mask over the at least pull-up transistors and a portion of the pull-down transistors, and performing a lightly doped ion implantation into transistors not being covered by the third mask.

In an embodiment, the second and third masks are formed by patterning a photoresist layer.

In an embodiment, the memory cell includes two pull-up transistors, four pull-down transistors, and two pass-gate transistors.

In an embodiment, the method further includes, prior to performing the first lightly-doped source and drain ion implantation, applying a lightly-doped ion implantation into the at least two pull-up transistors, the at least two pull-down transistors, and the at least two pass-gate transistors.

In an embodiment, the pull-up transistors, the pull-down transistors, and the pass-gate transistors have a fin-shaped structure.

Embodiments of the present invention also provide a semiconductor device that includes a multitude of memory cells. Each of the memory cells includes at least two pull-up transistors, at least two pull-down transistors, and at least two pass-gate transistors. A portion of the two pull-down transistors and the pass-gate transistors have different doping concentrations.

In an embodiment, each of the memory cell includes two pull-up transistors, four pull-down transistors, and two pass-gate transistors, two of the four pull-down transistors having a doping concentration different from a doping concentration of the other two pull-down transistors.

In an embodiment, the pull-up, pull-down, and pass-gate transistors are finFETs. In an embodiment, the semiconductor device includes a static random access memory device.

The following detailed description together with the accompanying drawings will provide a better understanding of the nature and advantages of the present invention.

DETAILED DESCRIPTION OF THE INVENTION

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

A highly doped source and drain ion implantation is referred to as an ion implantation of source and drain regions with impurities to a concentration of at least 10E18 ($10^{18}$) atoms per cm$^3$ or a dose of at least 10E14 ($10^{14}$) atoms per cm$^2$. A lightly doped source and drain ion implantation is referred to as an ion implantation of source and drain regions with impurities to a concentration in the range of 10E14 ($10^{14}$) to 10E15 ($10^{15}$) atoms per cm$^3$ or a dose of 10E10 to 10E11 ($10^{10}$ to $10^{11}$) atoms per cm$^2$.

The term "ratio" is referred to as the driving strength ratio between the different types of transistors. For example, an "α" (alfa) ratio is referred to as the driving strength ratio between the pull-down transistor and the pull-up transistor. A "β" (beta) ratio is referred to as the driving strength ratio between the pull-down transistor and the pass-gate transistor. A "γ" (gamma) ratio is referred to as the driving strength ratio between the pull-down transistor and the pass-gate transistor ratio.

A front-end device is referred to as a device made with front end of the line processes. A front-end device may include steps performed on a wafer up to but not including formation of metal lines. A front-end device may include various active and passive devices such as transistors, resistors, capacitors, etc.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

First Embodiment

According to a first embodiment of the present invention, a static random access memory (SRAM) device may include a multitude of memory cells. Each memory cell may include at least two pull-down (PD) transistors, at least two pull-up (PU) transistors, and at least two pass-gate (PG) transistors.

Processing steps of the present invention for making a semiconductor device can be used in making logic devices other than SRAM devices. The SRAM devices can be formed using finFETs.

Figure 1:
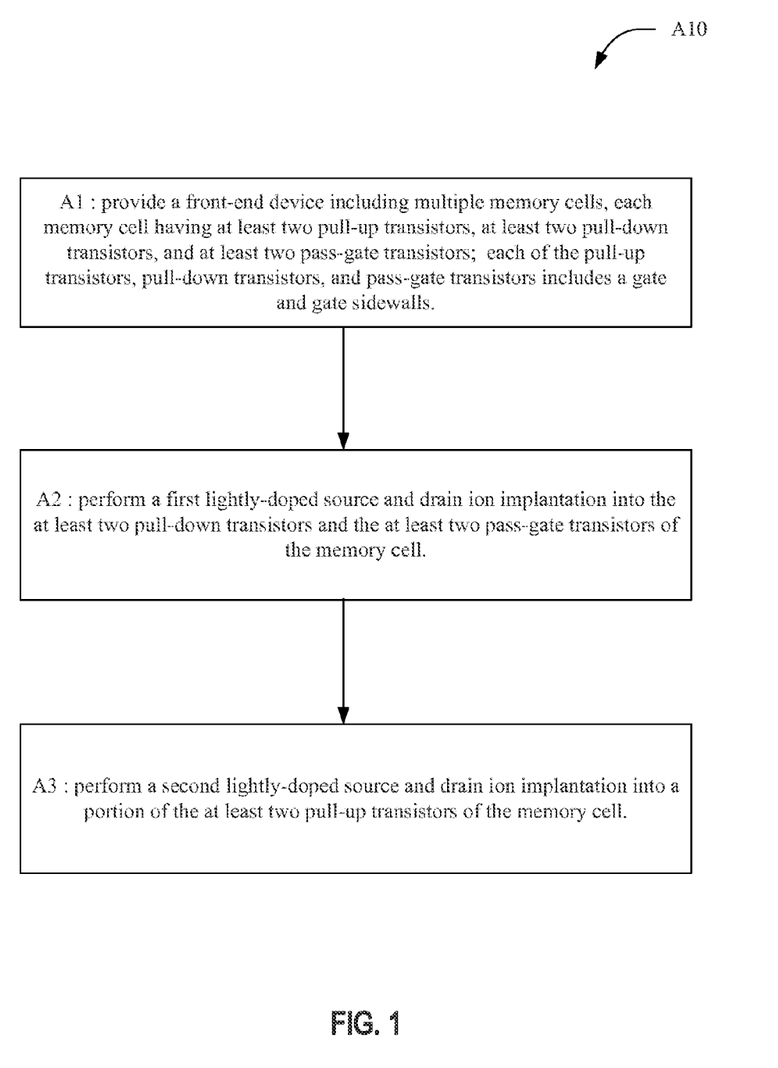
FIG. 1 is a flow chart of a method of fabricating a semiconductor device according to an embodiment of the present invention.

FIG. 1 is a flow chart of a method A10 of fabricating a semiconductor device according to an embodiment of the present invention. Method A10 may include:

At block A1: provide a front-end device having a multitude of memory cells. A memory cell may include at least two pull-up (PU) transistors, at least two pull-down (PD) transistors, and at least two pass-gate (PG) transistors.

At block A2: perform a first lightly doped source and drain ion implantation into the at least two PD transistors and the at least two PG transistors.

At block A3: perform a second lightly doped source and drain ion implantation into a portion of the at least two PD transistors and the at least two PG transistors.

In an embodiment, method A10 may include block A12 (not shown) between blocks A1 and A2. Block A12 may include applying a third ion implantation to implant third lightly doped source and drain regions of the at least two PU transistors, the at least two PD transistors, and the at least two PD transistors.

In a specific embodiment, in block A1, the PU, PD, and PG transistors each have a fin-typed structure, so that the PU, PD, and PG transistors are finFET-type transistors. The semiconductor device may include SRAM memory cells or other memory devices formed using the finFET-typed PU, PD, and PG transistors.

In this embodiment, the first and second ion implantation to implant first and second lightly doped source and drain regions in respective blocks A2 and A3 are not limited to specific ion implantations.

In this embodiment, the method mainly includes performing lightly doped ion implantation into PD and PG transistors. The method may include performing lightly doped ion implantation (LDD) into logic devices (including PU transistors, PD transistors, and PG transistors). This step may be omitted. After performing ion implantation into the PG transistors and PD transistors of the memory cells, the method includes performing a second lightly doped ion implantation into a portion of the PD transistors (the lightly doped ion implantation may be concurrently performed into the PG transistor) to form PD and PG transistors having different dopant concentrations. When the semiconductor device is a SRAM, the SRAM device can have different ratios. This method is particularly suitable to solve the small process window issue of finFET-typed SRAM devices having a constant width.

In the following exemplary embodiment, the semiconductor device includes a SRAM device. The SRAM device may include a memory cell having 4 PD transistors, 2 PU transistors, and 2 PG transistors.

Figure 2A:
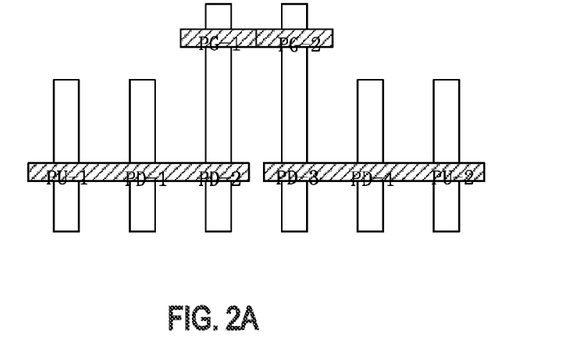
FIGS. 2A through 2D are simplified schematic diagrams illustrating intermediate process steps of a method of fabricating a semiconductor device according to an embodiment of the present invention.

Referring to FIGS. 2A through 2D and FIG. 4, a method for manufacturing a finFET-type memory device may include:

At block B1: provide a front-end device including a multitude of memory cells. FIG. 2A is a plan view of a memory cell according to an embodiment of the present invention. The memory cell includes 2 PU transistors PU-1 and PU-2, 4 PD transistors PD-1, PD-2, PD-3, and PD-4, and 2 PG transistors PG-1 and PG-2, as shown in FIG. 2A.

In an embodiment, the PU transistors, the PD transistors, and the PG transistors each include a fin structure, a gate, and gate sidewalls (not shown). FIG. 2A is a plan view of a memory cell of a front-end device provided at block B1 of FIG. 4.

Figure 2B:
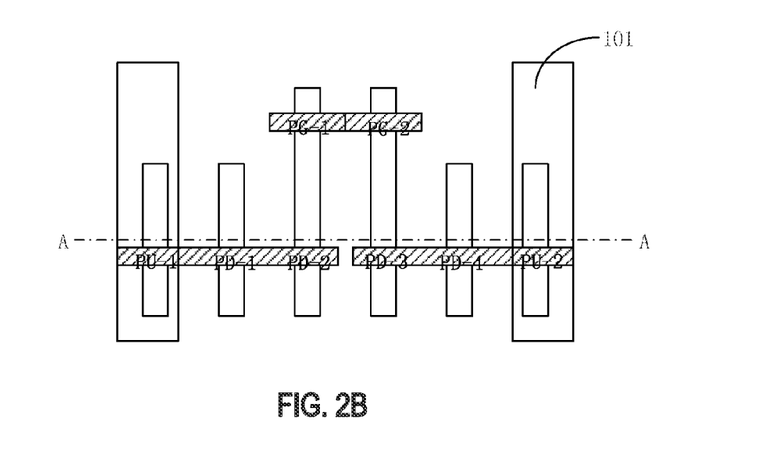

At block B2: a first mask 101 is formed on the two PU transistors PU-1 and PU-2, as shown in FIG. 2B. Thereafter, a first lightly doped ion implantation 211 at a first tilt angle "a" is performed into the 4 PD transistors PD-1, PD-2, PD-3, and PD-4 and the 2 PG transistors PG-1 and PG-2, as shown in FIG. 2C.

FIG. 2B is a plan view of the memory cell after the first mask 101 has been formed. FIG. 2C is a simplified cross-sectional view of FIG. 2B taken along the line AA. The arrows in FIG. 2C represent the direction of ion implantation into the front-end device.

Figure 2C:
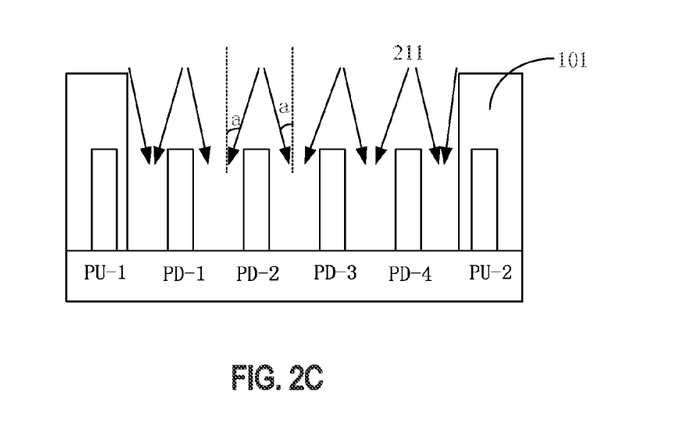

The tilt angle "a" is an angle relative to the perpendicular direction of the lateral surface of the front-end device, as shown in FIG. 2C. In an embodiment, the angle "a" is small and can be 0 degree to ensure that areas not masked by the mask 101 are doped by the first lightly doped ion implantation.

Figure 2D:
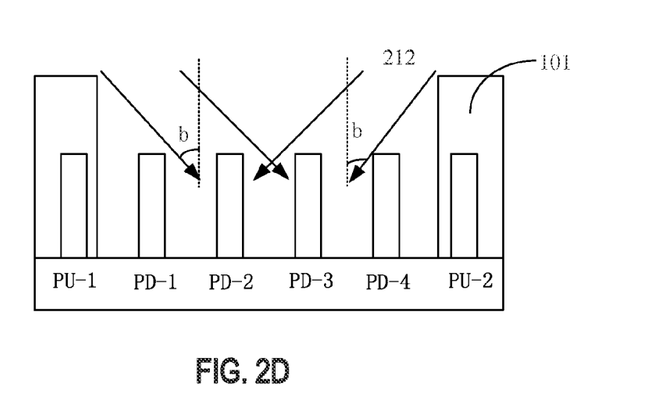

At block B3: a second lightly doped ion implantation 212 at a second tilt angle "b" is performed into a portion of the 4 PD transistors PD-1, PD-2, PD-3, and PD-4 of the front-end device. In a specific embodiment, because PD transistors PD-1 and PD-4 are disposed in the shadow region of the mask 101, only PD transistors PD-2 and PD-3 may be doped by the second ion implantation 212.

The second angle "b" is an angle relative to the perpendicular direction of the lateral surface of the front-end device, as shown in FIG. 2D. The second angle "b" is relatively large so that mainly the PD transistors PD-2 and PD-3 are doped by the second ion implantation. The first angle "a" is smaller than the second angle "b", as shown in FIGS. 2C and 2D.

At block B3, PD transistors PD-1 and PD-4 are disposed near the first mask 101 and may not be ion implanted in the second ion implantation 212, as shown in FIG. 2D.

Obviously, the two PG transistors PG-1 and PG-2 are disposed at a similar distance from the first mask 101 as those of PD transistors PD-2 and PD-3, they will also be doped by the second ion implantation 212. However, because the PG transistors PG-1 and PG-2 are disposed away from the PD transistors PD-2 and PD-3, PG-1 and PG-2 may be doped with a dose or doping concentration relatively lower than the dose or doping concentration of PD-2 and PD-3.

In an embodiment, the first mask 101 may be formed by patterned a photoresist layer or any suitable mask materials.

In an embodiment, the method may include an intermediate process block B12 (not shown) between process blocks B1 and B2. Block B12 may include performing a lightly doped ion implantation into the two PU transistors, the four PD transistors, and the two PG transistors.

This method of manufacturing a semiconductor device provides pass-gate transistors and pull-down transistors having different dopant concentrations to obtain different SRAM device ratios.

Second Embodiment

Figure 3A:
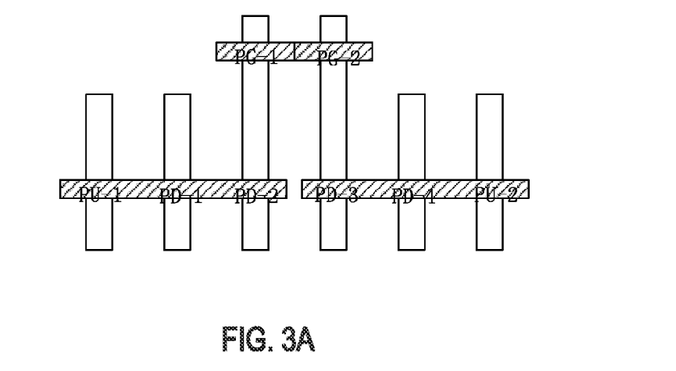
FIGS. 3A through 3E are simplified schematic diagrams illustrating intermediate process steps of a method of fabricating a semiconductor device according to another embodiment of the present invention.
Figure 5:
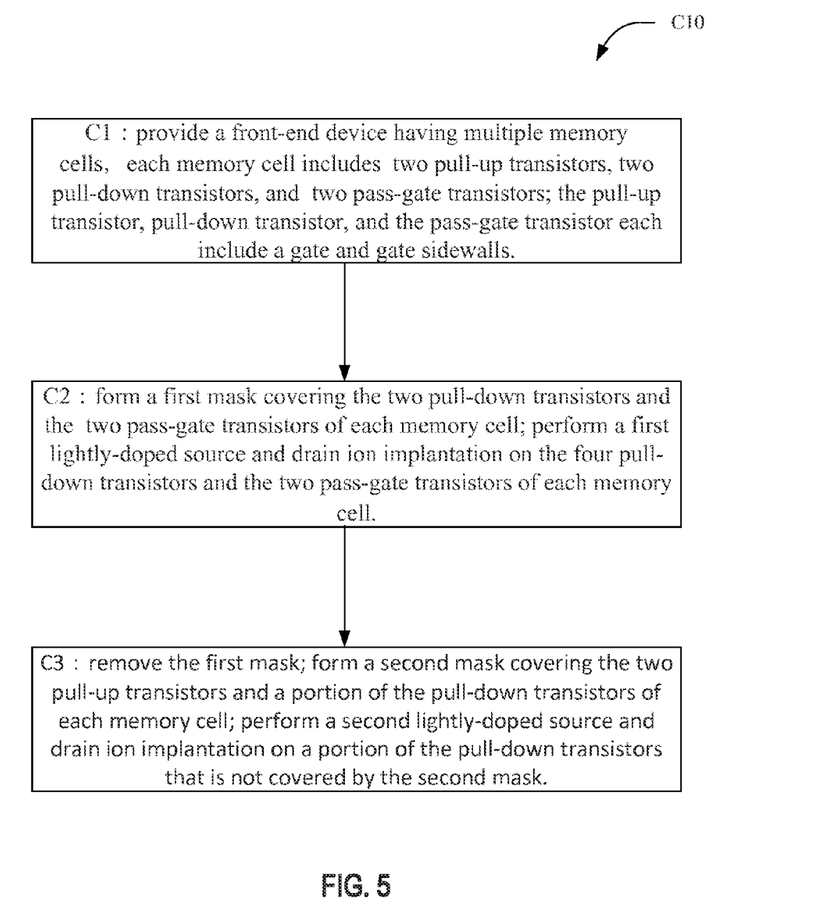
FIG. 5 is a flow chart of a method of fabricating a semiconductor device according to another embodiment of the present invention.

FIGS. 3A through 3E and FIG. 5 illustrate an exemplary implementation of a method C10 for fabricating a semiconductor device according to a second exemplary embodiment of the present invention. FIGS. 3A through 3E illustrate intermediate process stages of a memory cell, and FIG. 5 illustrates a flow chart of a method for fabricating the memory cell, in accordance with the second exemplary embodiment of the present invention. Method C10 may include:

At block C1: a front-end device having a multitude of memory cells is provided. FIG. 3A is a plan view of a memory cell according to the exemplary embodiment of the present invention. The memory cell includes two PU transistors PU-1 and PU-2, four PD transistors PD-1, PD-2, PD-3, and PD-4, and two PG transistors PG-1 and PG-2, as shown in FIG. 3A.

The PU, PD, and PG transistors each include a fin structure, a gate, and gate sidewalls (not shown).

Figure 3B:
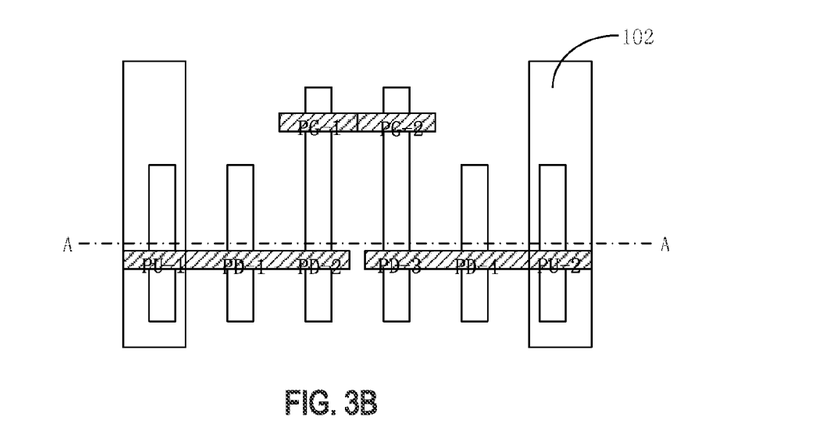
Figure 3C:
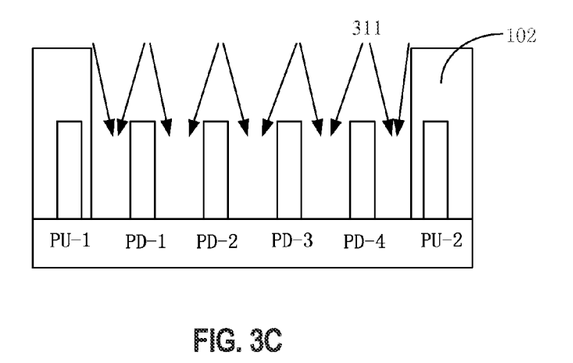

At block C2: a mask 102 is formed on the two PU transistors PU-1 and PU-2, as shown in FIG. 3B. Thereafter, a first lightly doped ion implantation 311 is performed into the four PD transistors PD-1, PD-2, PD-3, and PD-4 and the two PG transistors PG-1 and PG-2, as shown in FIG. 3C. FIG. 3B is a plan view of the front-end device after the formation of the mask 102. FIG. 3C is a cross-sectional view taken along the line AA of FIG. 3B. The arrows of FIG. 3C represent the direction of the lightly doped ion implantation 311. The lightly doped ion implantation 311 may be performed at a tilt angle similar to the tilt angle "a" of FIG. 3C (2C in Chinese specification) to ensure that areas not covered by the mask 102 are lightly doped.

At block C3: the mask 102 is removed. A mask 103 is then formed on the two PU transistors PU-1 and PU-2 and a portion of the PD transistors, e.g., PD-1 and PD-4 that are near the respective PU-1 and PU-2. Thereafter, a second lightly doped ion implantation 312 is performed on the PD transistors PD-2 and PD-3 that are not masked by the mask 103, as shown in FIG. 3E.

Of course, the PG transistors PG-1 and PG-2 that are not masked by the mask 103 are also lightly doped by the second lightly doped ion implantation 312. However, because of their position relative to the PD-2 and PD-3, the PG transistors PG-1 and PG-2 may have a dose lower than the dose of the PD transistors PD-2 and PD-3.

Figure 3D:
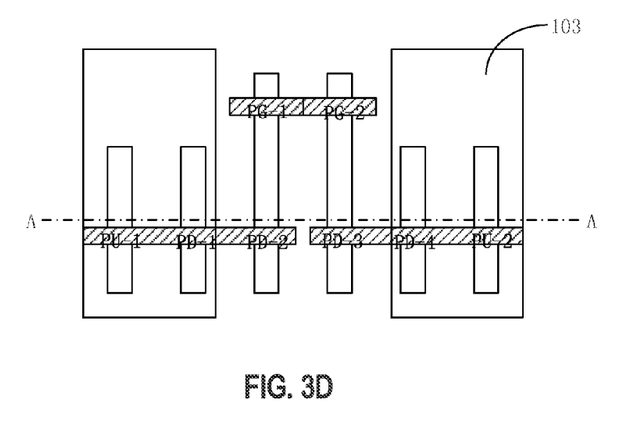
Figure 3E:
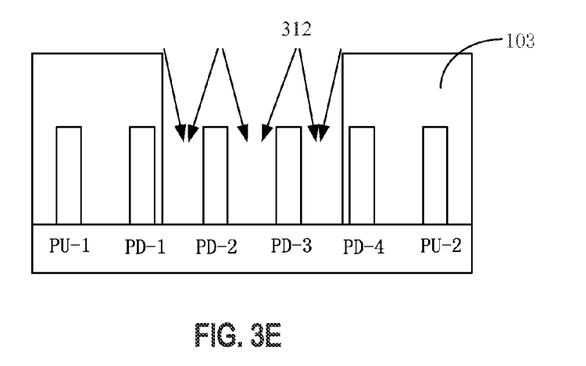

FIG. 3D is a plan view of the front-end device after the formation of the mask 103. FIG. 3E is a cross-sectional view taken along the line AA of FIG. 3D. The arrows shown in FIG. 3E represent the direction of the second lightly doped ion implantation 312. The second lightly doped ion implantation 312 is performed at a tilt angle similar to the tilt angle at block C2. In other words, the tilt angle of the second lightly doped ion implantation 312 may be in the same range as the tilt angle "a" of FIG. 2C described above. The tilt angle of second lightly doped ion implantation 312 is small to ensure that areas not masked by the mask 103 (i.e., PD-2 and PD-3) are doped by the second lightly doped ion implantation 312.

Because of the mask 103, this approach allows a more controllable and precise lightly doped ion implantation comparing to the process in step B3 described above that uses the shadow effect of the mask 101 and a relative large tilt angle to prevent that PD-1 and PD-4 from being doped by the first lightly doped ion implantation. Indeed, the blocks C1 and C2 of the second embodiment are the same as blocks B1 and B2 of the first embodiment, the difference is in block C3 (and B3) where the mask 103 is added, so that the lightly doped source and drain ion implantation (i.e., the second lightly doped ion implantation) can be more accurate and controllable.

In an embodiment, the mask 102 and the mask 103 may be a patterned photoresist layer or any suitable materials.

In an embodiment, there may be an intermediate process step C12 between the blocks C1 and C2. The intermediate process C12 may include applying an lightly doped source and drain ion implantation to the two PU transistors, four PD transistors and two PG transistors of the memory cell. This embodiment provides a method of manufacturing a semiconductor device having transfer gate transistors and pull-down transistors that have different concentrations to obtain SRAM devices with different ratios.

It is noted that there may be other process steps after the blocks A3, B3, or C3 for the completion of the semiconductor device. In the example in FIGS. 3A-3E, a memory cell having 4 PD transistors, 2 PU transistors, and 2 PG transistors has been described, but it is understood that the invention is not limited thereto. For example, embodiments of the present invention are applicable to memory cells each having 2 or more PD transistors, 2 or more PU transistors, and 2 or more PG transistors. It is also understood that the present invention is not limited to SRAM devices and is applicable to all the above memory cell structures and other semiconductor devices.

According to embodiments of the present invention, by performing lightly ion source and drain implantation with different concentrations to the transistors, pass-gate transistors and pull-down transistors with different doping concentration are formed. When the semiconductor device is a SRAM device, the SRAM device may have different ratios.

FIG. 1 is a flow chart of a method A10 for manufacturing a semiconductor device according to an embodiment of the present invention. Method A10 includes:

At block A1: provide a front-end device including a multitude of memory cells. Each memory cell includes at least two pull-up transistors, at least two pull-down transistors, and at least two pass-gate transistors. The pull-up, pull-down, and pass-gate transistor each have a gate and gate sidewalls;

At block A2: perform a first lightly-doped source and drain ion implantation into the at least two pull-up transistors, at least two pull-down transistors, and at least two pass-gate transistors;

At block A3: perform a second lightly-doped source and drain ion implantation into a portion of the at least two pull-down transistors.

Figure 4:
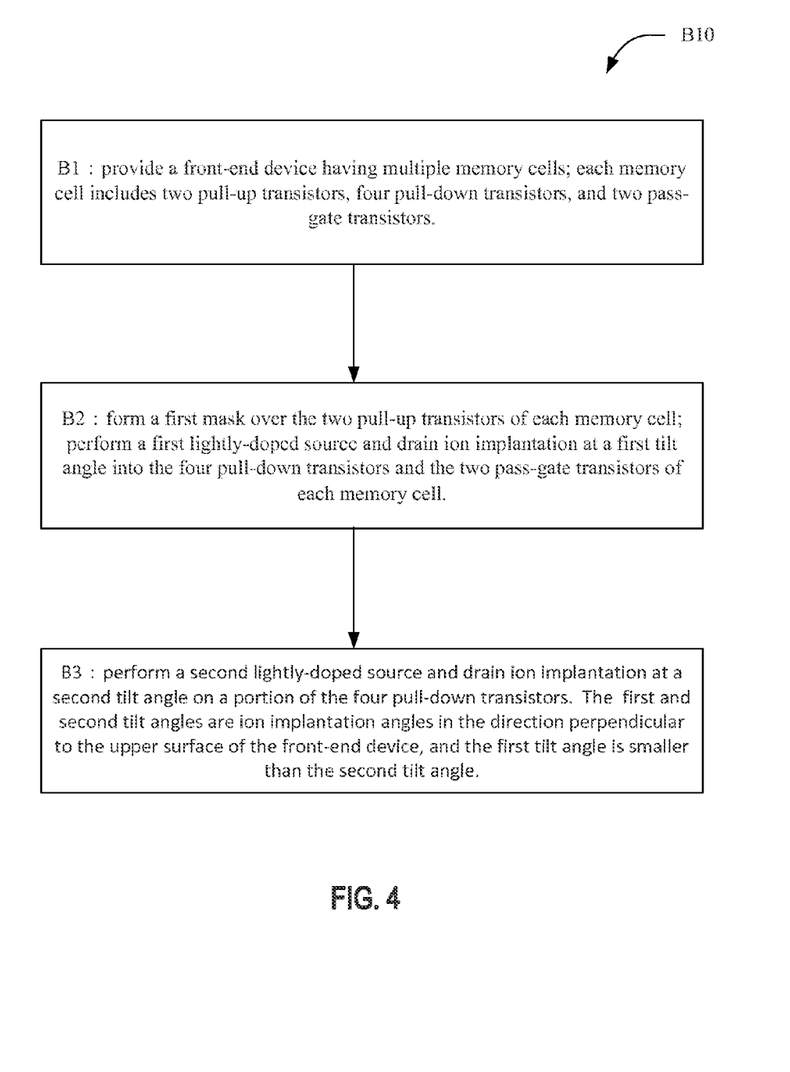
FIG. 4 is a flow chart of a method of fabricating a semiconductor device according to an embodiment of the present invention.

FIG. 4 is a flow chart of a method B10 for manufacturing a semiconductor device according to another embodiment of the present invention. Method B10 includes:

At block B1: provide a front-end device including a multitude of memory cells. Each memory cell includes two pull-up transistors, four pull-down transistors, and two pass-gate transistors;

At block B2: form a first mask over the two pull-up transistors; and perform a first lightly-doped source and drain ion implantation at a first tilt angle into the four pull-down transistors, and the two pass-gate transistors of each memory cell;

At block B3: perform a second lightly-doped source and drain ion implantation at a second tilt angle into a portion of the four two pull-down transistors. The first and second tilt angles are ion implantation angles in the direction perpendicular to the upper surface of the front-end device. The first tilt angle is smaller than the second tilt angle.

FIG. 5 is a flow chart of a method C10 for manufacturing a semiconductor device according to another embodiment of the present invention. Method C10 includes:

At block C1: provide a front-end device including a multitude of memory cells. Each memory cell includes two pull-up transistors, four pull-down transistors, and two pass-gate transistors;

At block C2: form a first mask over the two pull-up transistors; and perform a first lightly-doped source and drain ion implantation at a first tilt angle into the four pull-down transistors, and the two pass-gate transistors of each memory cell;

At block C3: remove the first mask; form a second mask over the two pull-up transistors and a portion of the pull-down transistors; and perform a second lightly-doped source and drain ion implantation at a second tilt angle into the portion of the pull-down transistors. The first and second tilt angles are ion implantation angles in the direction perpendicular to the upper surface of the front-end device. In an embodiment, the first and second tilt angles may be the same.

In other embodiment, a semiconductor device includes a multitude of memory cells. Each memory cell may include at least two pull-up transistors, at least two pull-down transistors, and at least two pass-gate transistors. The at least two pull-up transistors and a portion of the pull-down transistors and the pass-gate transistor are doped with different doping concentrations.

In yet another embodiment, a semiconductor device includes a multitude of memory cells. Each memory cell may include two pull-up transistors, four pull-down transistors, and two pass-gate transistors. Two of the four pull-up transistors have different doping concentrations than the other two pull-up transistors.

In an embodiment, the pull-up, pull-down, and pass-gate transistor are finFET-typed transistors. The semiconductor device is a static random access memory device. By ion implanting different doping concentrations to the pass-gate transistors and the pull-down transistors, the SRAM device may have different ratios.

Embodiments of the present invention also provide an electronic device that may include a semiconductor device having memory cells of the structures of the different exemplary embodiments described above, such as memory cells having different numbers of pull-up, pull-down, and pass-gate transistors described above. Because the electronic device uses such semiconductor devices having different ratios, the electronic device may have a better performance. In an embodiment, the electronic device can be a mobile phone, tablet PC, laptop, netbook, game console, still camera, video camera, voice recorder, MP3, MP4, PSP, and the like.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of forming a semiconductor device, the method comprising:
   providing a front-end device having a plurality of memory cells, each memory cell including at least two pull-up transistors, at least two pull-down transistors, and at least two pass-gate transistors, the pull-up transistors, the pull-down transistors, and the two pass-gate transistors each having a gate and gate sidewalls;
   forming a mask over the at least two pull-up transistors;
   performing a first lightly doped source and drain ion implantation at a first tilted angle into the at least two pull-down transistors and the at least two pass-gate transistors; and
   performing a second lightly doped source and drain ion implantation at a second tilted angle into a portion of the at least two pull-down transistors and the at least two pass-gate transistors;
   wherein the first tilt angle and the second tilt angle are angles relative to a direction perpendicular to a surface of the front-end device, and the first tilt angle is smaller than the second tilt angle.

2. The method of claim 1, wherein performing the second angled ion implantation at a second angle comprises:
   using a shadow region of the mask to prevent a portion of the pull-down transistors disposed within the shadow region from being doped.

3. The method of claim 1, wherein forming the first mask comprises:
   patterning a photoresist layer.

4. The method of claim 1, wherein the memory cell comprises two pull-up transistors, four pull-down transistors, and two pass-gate transistors, the second ion implantation is performed on two pull-down transistors.

5. The method of claim 1, further comprising, prior to performing the first lightly doped ion implantation:
   performing a lightly-doped source and drain ion implantation into the at least two pull-down transistors and the at least two pass-gate transistors.

6. The method of claim 1, wherein the pull-up transistors, the pull-down transistors, and the pass-gate transistors are fin-FET transistors.

7. The method of claim 1, wherein the semiconductor device is a static random access memory.

8. A method of forming a semiconductor device, the method comprising:
   providing a front-end device having a plurality of memory cells, each memory cell including at least two pull-up transistors, at least two pull-down transistors, and at least two pass-gate transistors, the pull-up transistors, the pull-down transistors, and the two pass-gate transistors each having a gate and gate sidewalls;
   forming a first mask over the at least two pull-up transistors; and
   performing a lightly-doped ion implantation into the at least two pull-down transistors and the at least pass-gate transistors;
   removing the first mask;
   forming a second mask over the at least two pull-up transistors and a portion of the pull-down transistors;
   performing a lightly doped ion implantation into transistors not being covered by the second mask.

9. The method of claim 8, wherein forming the first mask and the second mask comprises:
   patterning a photoresist layer.

10. The method of claim 8, wherein the pull-up transistors, the pull-down transistors, and the pass-gate transistors are fin-FET transistors.

11. A method of forming a semiconductor device, the method comprising:
    providing a front-end device having a plurality of memory cells, each memory cell including two pull-up transistors, first, second, third, and fourth pull-down transistors arranged sequentially between the two pull-up transistors, and two pass-gate transistors;
    forming a first mask over the two pull-up transistors;
    performing a first lightly doped source and drain ion implantation into the first, second, third, and fourth pull-down transistors and the two pass-gate transistors;
    removing the first mask;
    forming a second mask over the two pull-up transistors and the first and fourth pull-down transistors in a vicinity of the two pull-up transistors; and
    performing a second lightly doped source and drain ion implantation into the third and fourth pull-down transistors not covered by the second mask and the two pass-gate transistors.

12. The method of claim 11, wherein the pull-up transistors, the pull-down transistors, and the pass-gate transistors are fin-FET transistors.

* * * * *